(12) United States Patent
Izawa et al.

(10) Patent No.: US 11,921,331 B2
(45) Date of Patent: Mar. 5, 2024

(54) OPTICAL RECEPTACLE AND OPTICAL MODULE

(71) Applicant: Enplas Corporation, Saitama (JP)

(72) Inventors: Takahiro Izawa, Saitama (JP); Akinobu Seki, Saitama (JP)

(73) Assignee: Enplas Corporation, Saitama (JP)

( * ) Notice: Subject to any disclaimer, the term of this patent is extended or adjusted under 35 U.S.C. 154(b) by 0 days.

(21) Appl. No.: 17/101,351

(22) Filed: Nov. 23, 2020

(65) Prior Publication Data

US 2021/0173157 A1    Jun. 10, 2021

(30) Foreign Application Priority Data

Nov. 26, 2019 (JP) ................. 2019-213215

(51) Int. Cl.
*G02B 6/42* (2006.01)
*G02B 5/18* (2006.01)
(Continued)

(52) U.S. Cl.
CPC ......... *G02B 6/4204* (2013.01); *G02B 5/1814* (2013.01); *G02B 6/4206* (2013.01); *G02B 6/4246* (2013.01); *G02B 5/1876* (2013.01); *G02B 6/4214* (2013.01); *G02B 6/4244* (2013.01); *G02B 6/4249* (2013.01); *G02B 2006/4297* (2013.01); *G02B 6/43* (2013.01); *G02B 27/0916* (2013.01);
(Continued)

(58) Field of Classification Search
CPC .. G02B 6/4204; G02B 5/1814; G02B 6/4206; G02B 6/4246; G02B 5/1876; G02B 6/4214; G02B 6/4244; G02B 6/4249; G02B 6/43; G02B 27/0916; G02B 2006/4297; H01S 5/02251; H01S 5/02253; H01S 5/02255; H01S 5/423

See application file for complete search history.

(56) References Cited

U.S. PATENT DOCUMENTS

2003/0012496 A1   1/2003  Yamagata
2003/0128916 A1 * 7/2003  Sasaki ................. G02B 6/4286
                                                        385/24
(Continued)

FOREIGN PATENT DOCUMENTS

EP    1033597 A1 *  9/2000  ........... G02B 5/1876
JP  2006146092 A  *  6/2006
(Continued)

*Primary Examiner* — Michelle R Connelly
(74) *Attorney, Agent, or Firm* — Shih IP Law Group, PLLC

(57) ABSTRACT

An optical receptacle including a first optical surface configured to allow incidence of light emitted from the light emitting element; a second optical surface configured to emit, toward the optical transmission member, light emitted from the light emitting element and advanced inside the optical receptacle; and a diffraction surface disposed on the first optical surface, on the second optical surface, or on a light path between the first optical surface and the second optical surface. The diffraction surface is configured such that primary diffraction light of the light emitted from the light emitting element reaches an end portion of the optical transmission member, and that zero-order diffraction light of the light emitted from the light emitting element does not reach the end portion of the optical transmission member.

10 Claims, 9 Drawing Sheets

(51) Int. Cl.
  *G02B 6/43* (2006.01)
  *H01S 5/02251* (2021.01)
  *H01S 5/02253* (2021.01)
  *H01S 5/02255* (2021.01)
  *G02B 27/09* (2006.01)
  *H01S 5/42* (2006.01)

(52) U.S. Cl.
  CPC ....... *H01S 5/02251* (2021.01); *H01S 5/02253* (2021.01); *H01S 5/02255* (2021.01); *H01S 5/423* (2013.01)

(56) References Cited

U.S. PATENT DOCUMENTS

| | | | | |
|---|---|---|---|---|
| 2009/0016676 A1* | 1/2009 | Morioka | .............. | G02B 6/4204 385/27 |
| 2011/0101255 A1* | 5/2011 | Tamura | ................ | G02B 6/4246 250/551 |
| 2018/0306952 A1* | 10/2018 | Marutani | ............. | G02B 5/1866 |
| 2020/0409000 A1 | 12/2020 | Kon | | |

FOREIGN PATENT DOCUMENTS

| | | |
|---|---|---|
| JP | 2019-159015 A | 9/2019 |
| WO | 0017691 A1 | 3/2000 |

\* cited by examiner

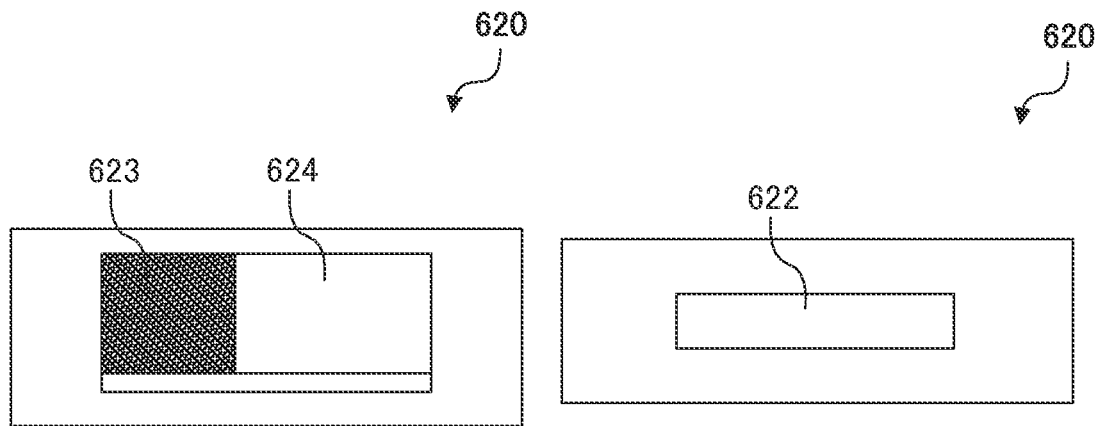
FIG. 9A
FIG. 9C
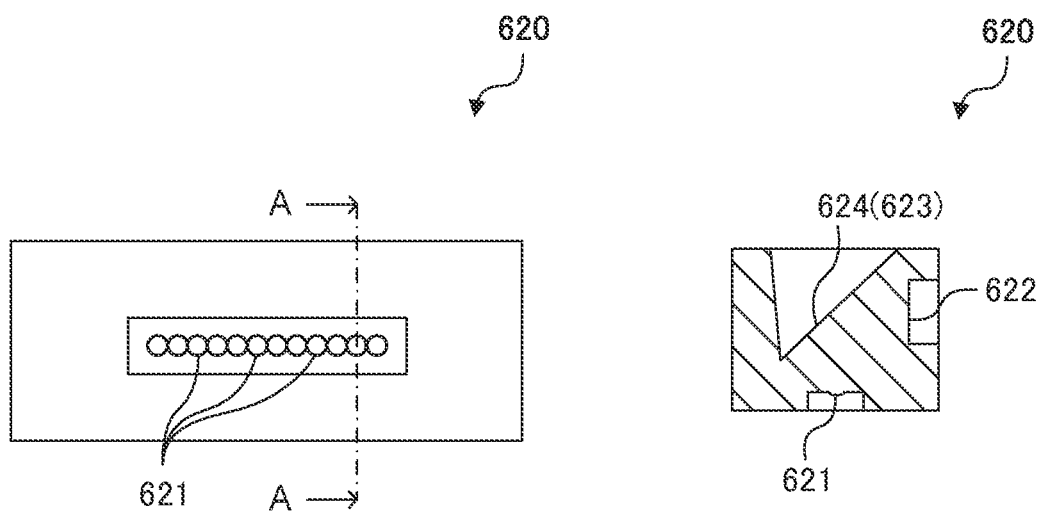
FIG. 9B
FIG. 9D

OPTICAL RECEPTACLE AND OPTICAL MODULE

CROSS REFERENCE TO RELATED APPLICATIONS

This application is entitled to and claims the benefit of Japanese Patent Application No. 2019-213215, filed on Nov. 26, 2019, the disclosure of which including the specification, drawings and abstract is incorporated herein by reference in its entirety.

TECHNICAL FIELD

The present invention relates to an optical receptacle and an optical module.

BACKGROUND ART

In the related art, an optical module including a light emitting element such as a surface emitting laser (e.g., vertical cavity surface emitting laser (VCSEL)) is used for optical communications using an optical transmission member such as an optical fiber and an optical waveguide. The optical module includes one or more photoelectric conversion elements (light emitting elements or light reception elements), and an optical receptacle (coupling lens) configured for transmission, reception, or transmission and reception.

In addition, for safety purposes, an optical module configured for light speed communication may attenuate the quantity of light emitted from a transmitting optical receptacle (see, for example, PTL 1). In addition, as a method for attenuating light emitted from a transmitting optical receptacle, an attenuation coating may be provided on the optical surface.

PTL 1 discloses a coupling lens for optically coupling a light source and an optical fiber. The coupling lens disclosed in PTL 1 includes an incidence surface on the light source side, and an emission surface on the optical fiber side. The emission surface is a so-called diffraction lens, and includes a ring-band that is concentric about the optical axis of the emission surface.

The coupling lens disclosed in PTL 1 adjusts the refraction efficiency of the diffraction lens such that zero-order diffraction light and primary diffraction light transmitted through the diffraction lens are utilized without utilizing secondary and subsequent diffraction light.

CITATION LIST

Patent Literature

PTL 1
WO00/17691

SUMMARY OF INVENTION

Technical Problem

The coupling lens disclosed in PTL 1 utilizes the zero-order diffraction light and the primary diffraction light, and therefore requires an optical design in consideration of adjustment of light of two diffraction orders, thus making it difficult to adjust the quantity of light in some cases. In addition, in the optical surface provided with the attenuation coating, the attenuation coating may be cracked, and attenuation of the light quantity of light may not be achieved.

In view of this, an object of the present invention is to provide an optical receptacle that can accurately attenuate light emitted from a light emitting element without using other members such as an optical filter and an attenuation coating. In addition, another object of the present invention is to provide such an optical module including the optical receptacle.

Solution to Problem

To achieve the above-mentioned object, an optical receptacle of an embodiment of the present invention is configured to be disposed between a light emitting element and an optical transmission member and configured to optically couple the light emitting element and the optical transmission member, the optical receptacle including a first optical surface configured to allow incidence of light emitted from the light emitting element; a second optical surface configured to emit, toward the optical transmission member, light emitted from the light emitting element and advanced inside the optical receptacle; and a diffraction surface disposed on the first optical surface, on the second optical surface, or on a light path between the first optical surface and the second optical surface. The diffraction surface is configured such that primary diffraction light of the light emitted from the light emitting element reaches an end portion of the optical transmission member, and that zero-order diffraction light of the light emitted from the light emitting element does not reach the end portion of the optical transmission member.

In addition, to achieve the above-mentioned object, an optical module of an embodiment of the present invention includes a photoelectric conversion device including a light emitting element; and an optical receptacle configured to optically couple, to an optical transmission member, light emitted from the light emitting element. The optical receptacle is the optical receptacle.

Advantageous Effects of Invention

An optical receptacle of an embodiment of the present invention can accurately attenuate the quantity of light emitted from the light emitting element.

BRIEF DESCRIPTION OF DRAWINGS

FIGS. 9A to 9D illustrate a configuration of an optical receptacle according to Embodiment 3.

DESCRIPTION OF EMBODIMENTS

An optical receptacle and an optical module according to an embodiment of the present invention are elaborated below with reference to the accompanying drawings.

Embodiment 1

Configuration of Optical Module

Figure 1:
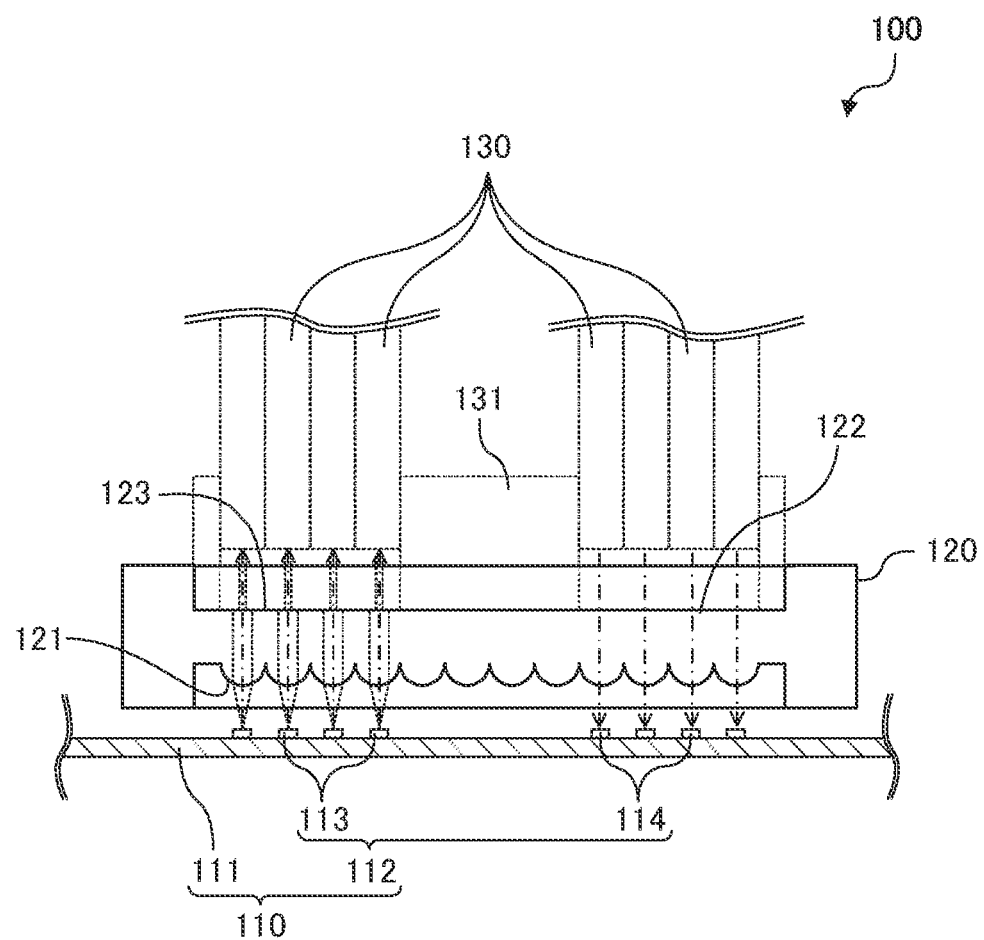
FIG. 1 is a sectional view of an optical module according to Embodiment 1.

FIG. 1 is a sectional view of optical module 100 according to Embodiment 1 of the present invention. Note that in FIG. 1, the hatching of optical receptacle 120 is omitted for illustration of light paths. In FIG. 1, the center of the light flux is illustrated with a dashed line, and the outline of the light flux is illustrated with a dotted line.

As illustrated in FIG. 1, optical module 100 includes photoelectric conversion device 110 including one or more photoelectric conversion elements 112, and optical receptacle 120. Optical module 100 is used in the state where optical transmission member 130 is connected to optical receptacle 120.

Photoelectric conversion device 110 includes substrate 111 and photoelectric conversion element 112.

On substrate 111, one or more photoelectric conversion elements 112 and optical receptacle 120 are disposed. On substrate 111, a protrusion (omitted in the drawing) for setting the position of optical receptacle 120 may be formed. By fitting a recess (omitted in the drawing) of optical receptacle 120 to the protrusion, optical receptacle 120 can be positioned at a predetermined position with respect to photoelectric conversion element 112 disposed on substrate 111. The material of substrate 111 is not limited. Substrate 111 is a glass composite substrate, a glass epoxy substrate, or the like, for example.

Photoelectric conversion element 112 emits light of a predetermined wavelength, or receives light of a predetermined wavelength. Photoelectric conversion element 112 is light emitting element 113 or light reception element 114, and is disposed on substrate 111. In transmitting optical module 100, light emitting element 113 is used as photoelectric conversion element 112. In receiving optical module 100, light reception element 114 is used as photoelectric conversion element 112. Light emitting element 113 is a vertical cavity surface emitting laser (VCSEL), for example. Light reception element 114 is a photodetector, for example. In the present embodiment, optical module 100 is transmitting and receiving optical module 100, and therefore photoelectric conversion element 112 includes four light emitting elements 113 and four light reception elements 114.

On substrate 111, optical receptacle 120 is disposed opposite to photoelectric conversion element 112. Optical receptacle 120 optically couples photoelectric conversion element 112 and the end surface of optical transmission member 130 in the state where optical receptacle 120 is disposed between photoelectric conversion element 112 and optical transmission member 130. In the present embodiment, optical receptacle 120 emits, toward the end surface of optical transmission member 130, light emitted from photoelectric conversion element 112 (light emitting element 113), and emits, toward photoelectric conversion element 112 (light reception element 114), light emitted from the end surface of optical transmission member 130. The configuration of optical receptacle 120 will be elaborated later.

The type of optical transmission member 130 is not limited. Examples of the type of optical transmission member 130 include an optical fiber and an optical waveguide. Optical transmission member 130 is connected to optical receptacle 120 through ferrule 131. In the present embodiment, optical transmission member 130 is an optical fiber. In addition, the optical fiber may be of a single mode type, or a multiple mode type. In the case where optical transmission member 130 is an optical fiber, optical transmission member 130 includes a core and a cladding.

Configuration of Optical Receptacle

Figure 2A:
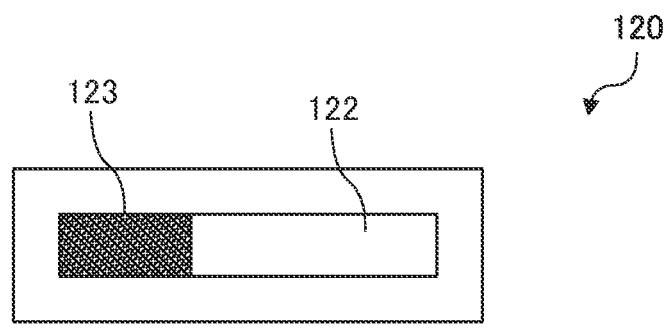
FIGS. 2A to 2C illustrate a configuration of an optical receptacle according to Embodiment 1.
Figure 2B:
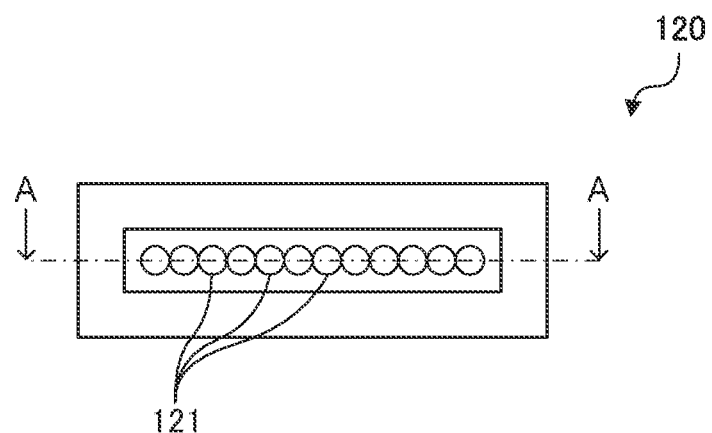
Figure 2C:
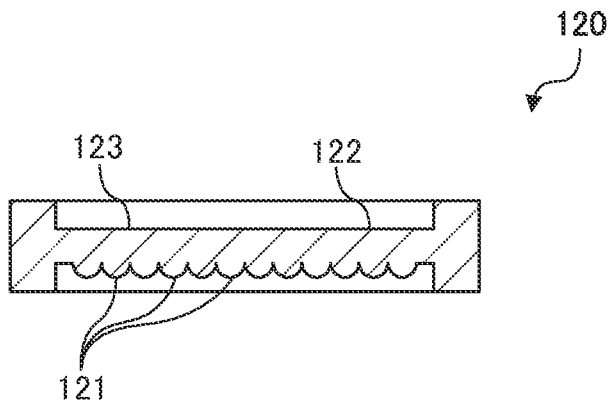

FIGS. 2A to 2C illustrate a configuration of optical receptacle 120 according to Embodiment 1. FIG. 2A is a plan view of optical receptacle 120 according to the present embodiment, FIG. 2B is a bottom view of optical receptacle 120, and FIG. 2C is a sectional view taken along line A-A of FIG. 2B.

As illustrated in FIGS. 2A to 2C, optical receptacle 120 is a member having a substantially cuboid shape. Optical receptacle 120 includes first optical surface 121, second optical surface 122, and a diffraction surface (diffraction grating) 123. Optical receptacle 120 according to the present embodiment is a transmitting and receiving optical receptacle, and therefore includes a region (transmission region) that serves a function of transmitting, to optical transmission member 130, light emitted from light emitting element 113, and a region (light reception region) that serves a function of receiving, at light reception element 114, light emitted from optical transmission member 130. In the example illustrated in FIGS. 2A to 2C, the left side in the drawing is the transmission region, and the right side in the drawing is the reception region.

Optical receptacle 120 is formed of a material that is optically transparent to light of a wavelength used for optical communications. Examples of the material of optical receptacle 120 include polyetherimide (PEI) such as ULTEM (registered trademark) and a transparent resin such as cyclic olefin resin. Optical receptacle 120 may be produced by injection molding, for example. Optical receptacle 120 is molded as one piece including diffraction surface 123.

First optical surface 121 is an optical surface that allows light emitted from photoelectric conversion element 112 (light emitting element 113) to enter optical receptacle 120, or is an optical surface that emits, toward photoelectric conversion element 112 (light reception element 114), light entered from second optical surface 122. In the present embodiment, first optical surfaces 121 are disposed opposite to photoelectric conversion element 112 in a line along the longitudinal direction. In the present embodiment, twelve first optical surfaces 121 are disposed in a line. In the example illustrated in FIG. 2B, four first optical surfaces 121 on the left side in the drawing function as incidence surfaces, four first optical surfaces 121 on the right side in the drawing function as emission surfaces, and four first optical surfaces 121 at the center are not used.

The shape of first optical surface 121 is not limited. The shape of first optical surface 121 may be a flat surface, a convex lens surface protruding toward photoelectric conversion element 112, or a concave lens surface recessed toward photoelectric conversion element 112. In the present embodiment, the shape of first optical surface 121 is a convex lens surface protruding toward photoelectric conversion element 112. In addition, first optical surface 121 has a circular shape in plan view. Preferably, the central axis of first optical surface 121 is perpendicular to the light-emitting surface or the light-receiving surface of photoelectric conversion element 112 (and the front surface of substrate 111). In addition, preferably, the central axis of first optical surface 121 coincides with the optical axis of light emitted from photoelectric conversion element 112 (light emitting element 113), or light incident on photoelectric conversion element 112 (light reception element 114).

Second optical surface 122 is an optical surface that emits, toward the end surface of optical transmission member 130, light entered from first optical surface 121, or is an optical surface that allows, to enter optical receptacle 120, light emitted from the end surface of optical transmission member 130. In the present embodiment, diffraction surface 123 is formed in a part of second optical surface 122. The shape of second optical surface 122 is not limited. The shape of second optical surface 122 may be a flat surface, a convex lens surface protruding toward the end surface of optical transmission member 130, or a concave lens surface recessed toward photoelectric conversion element 112. In the present embodiment, the shape of second optical surface 122 is a flat surface. In the example illustrated in FIG. 2A, the region on the left side in the drawing functions as the emission surface, the region on the right side in the drawing functions as the incidence surface, and the region at the center is not used.

Diffraction surface 123 focuses predetermined diffraction light toward the end portion of optical transmission member 130. In the present embodiment, preferably, diffraction surface 123 is configured such that primary diffraction light reaches the end portion of optical transmission member 130 whereas zero-order diffraction light does not reach the end portion of optical transmission member 130 such that only primary diffraction light reaches the end portion of optical transmission member 130.

The shape of diffraction surface 123 is appropriately set in accordance with the proportion of light to be attenuated. In diffraction surface 123, a blazed shape (saw-tooth shape) may be formed by applying a hologram technique capable of freely shaping the focal point position and/or the focusing shape of laser light (https://www.science-academy.jp/showcase/15/list.html, General Poster Presentation, No. p-44), for example. The shape of the surface (in the present embodiment, the second optical surface) where the blazed shape is formed is not limited. The shape of the surface where the blazed shape is formed may be a flat surface, or a curved surface. That is, in diffraction surface (transmission (type) diffraction grating) 123 of the present embodiment, the blaze number, the blaze angle, the shape of the installation surface are appropriately set in accordance with the attenuation rate and the focusing position of the diffraction light. In addition, it may be appropriately set such that the light intensity differs depending on the focusing position. For example, light may be focused such that higher intensity light reaches the center of the optical transmission member than in the outer edge.

Next, light paths in optical module 100 according to the present embodiment are described. Light emitted from photoelectric conversion element 112 (light emitting element 113) enters optical receptacle 120 from first optical surface 121. At this time, light entered into optical receptacle 120 is converted to collimated light by first optical surface 121, and advances inside optical receptacle 120. Next, the light entered into optical receptacle 120 is emitted by second optical surface 122 toward the end portion of optical transmission member 130. Here, diffraction surface 123 is disposed in second optical surface 122, and therefore, of the diffraction light generated from light advanced inside optical receptacle 120, only primary diffraction light reaches the end portion of optical transmission member 130 (see FIG. 1). Note that, preferably, the primary diffraction light reaches the core, rather than the cladding of optical transmission member (optical fiber) 130. With such a configuration, the quantity of the light emitted from light emitting element 113 can be correctly adjusted. Note that in the present embodiment, no zero-order diffraction light is generated. In addition, secondary and subsequent diffraction light is generated, but the quantity of the light of the order higher than the secondary diffraction light is significantly small, and therefore such light is not required to be taken into consideration.

On the other hand, light emitted from the end surface of optical transmission member 130 enters optical receptacle 120 from second optical surface 122 where no diffraction surface 123 is formed in the reception region. Next, the light entered into optical receptacle 120 is emitted, at first optical surface 121, to the outside of optical receptacle 120 toward photoelectric conversion element 112 (light reception element 114). The light emitted to the outside of optical receptacle 120 at first optical surface 121 reaches photoelectric conversion element 112 (light reception element) while being converged (see FIG. 1).

Effect

Optical receptacle 120 according to the present embodiment generates only primary diffraction light with diffraction surface 123, and thus attenuates the quantity of the light that enters optical transmission member 130 from light emitting element 113. With this configuration, the quantity of the light emitted from the light emitting element can be accurately attenuated without using another member.

Modification 1

Next, an optical module according to Modification 1 of the present embodiment is described. The optical module according to the present modification differs from optical module 100 according to Embodiment 1 only in the configuration of optical receptacle 220. In view of this, the components similar to those of optical module 100 according to Embodiment 1 are denoted with the same reference numerals and the description thereof is omitted.

Figure 3A:
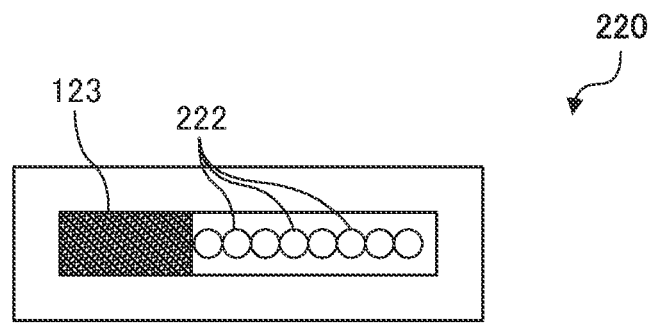
FIGS. 3A to 3C illustrate a configuration of an optical receptacle according to Modification 1 of Embodiment 1.
Figure 3B:
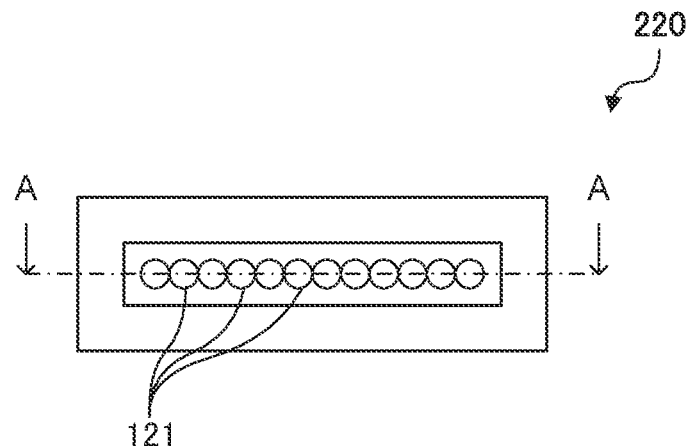
Figure 3C:
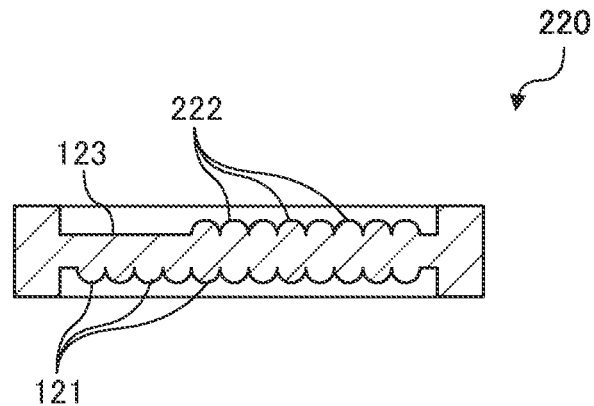

FIGS. 3A to 3C illustrate a configuration of optical receptacle 220 according to Modification 1 of Embodiment 1. FIG. 3A is a plan view of optical receptacle 220 according to Modification 1 of the present embodiment, FIG. 3B is a bottom view of optical receptacle 220, and FIG. 3C is a sectional view taken along line A-A of FIG. 3B.

Configuration of Optical Receptacle

As illustrated in FIGS. 3A to 3C, optical receptacle 220 includes first optical surface 121, second optical surface 222, and diffraction surface 123. In the present embodiment, in the reception region, second optical surface 222 is a convex lens surface protruding toward optical transmission member 130. In the reception region, second optical surfaces 222 are disposed opposite to the end surface of optical transmission member 130 in a line along the longitudinal direction. Preferably, the central axis of second optical surface 222 coincides with the central axis of the end surface of optical transmission member 130.

Also in the optical module according to Modification 1 of the present embodiment, diffraction surface 123 is preferably configured such that primary diffraction light reaches the end portion of optical transmission member 130 whereas zero-order diffraction light does not reach the end portion of optical transmission member 130 such that only primary diffraction light reaches the end portion of optical transmission member 130.

Effect

The optical module according to the present embodiment can achieve an increased coupling efficiency on the reception side while achieving the same effect as that of optical module 100 according to Embodiment 1.

Modification 2

Next, an optical module according to Modification 2 of the present embodiment is described. The optical module according to the present modification differs from optical module 100 according to Embodiment 1 only in the configuration of optical receptacle 320. In view of this, the components similar to those of optical module 100 according to Embodiment 1 are denoted with the same reference numerals and the description thereof is omitted.

Figure 4A:
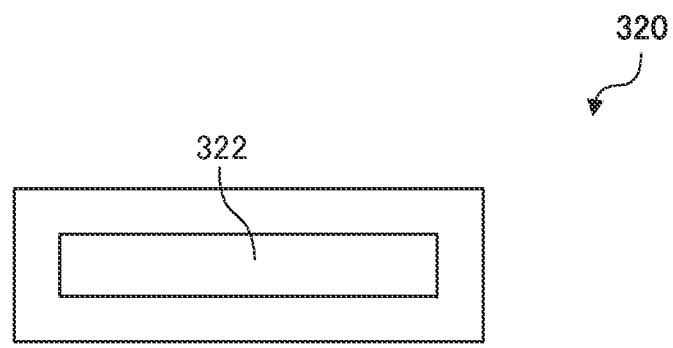
FIGS. 4A to 4C illustrate a configuration of an optical receptacle according to Modification 2 of Embodiment 1.
Figure 4B:
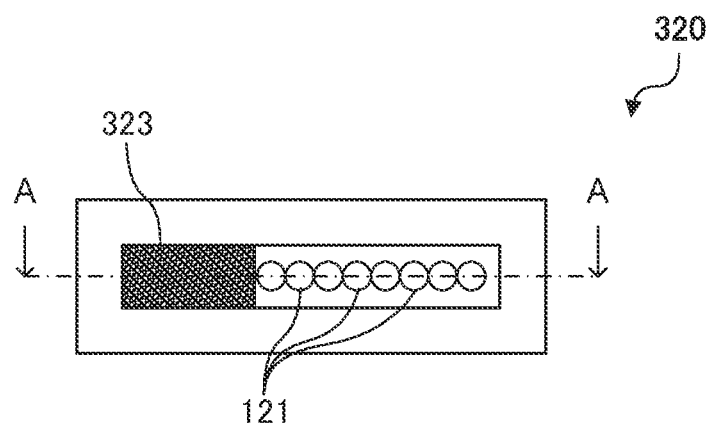
Figure 4C:
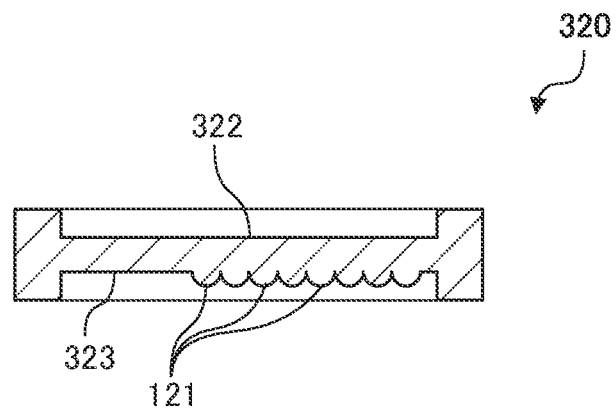

FIGS. 4A to 4C illustrate a configuration of optical receptacle 320 according to Modification 2 of Embodiment 1. FIG. 4A is a plan view of optical receptacle 320 according to Modification 2 of the present embodiment, FIG. 4B is a bottom view of optical receptacle 320, and FIG. 4C is a sectional view taken along line A-A of FIG. 4B.

Configuration of Optical Receptacle

As illustrated in FIGS. 4A to 4C, optical receptacle 320 includes first optical surface 121, second optical surface 322, and diffraction surface 323. In the present embodiment, in the transmission region, first optical surface 121 is a flat surface disposed opposite to photoelectric conversion element 112. In addition, in the present embodiment, diffraction surface 323 is formed in first optical surface 121 in the transmission region. In the present embodiment, no diffraction surface 323 is formed in second optical surface 322.

Also in the optical module according to Modification 2 of the present embodiment, diffraction surface 323 is preferably configured such that primary diffraction light reaches the end portion of optical transmission member 130 whereas zero-order diffraction light does not reach the end portion of optical transmission member 130 such that only primary diffraction light reaches the end portion of optical transmission member 130.

Effect

The optical module according to the present embodiment has an effect similar to that of optical module 100 according to Embodiment 1.

Modification 3

Next, an optical module according to Modification 3 of the present embodiment is described. The optical module according to the present modification differs from optical module 100 according to Embodiment 1 only in the configuration of optical receptacle 420. In view of this, the components similar to those of optical module 100 according to Embodiment 1 are denoted with the same reference numerals and the description thereof is omitted.

Figure 5A:
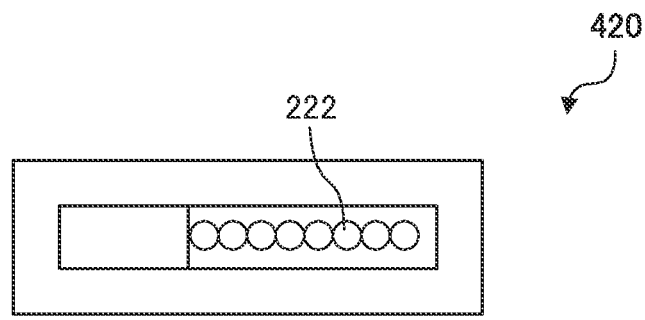
FIGS. 5A to 5C illustrate a configuration of an optical receptacle according to Modification 3 of Embodiment 1.
Figure 5B:
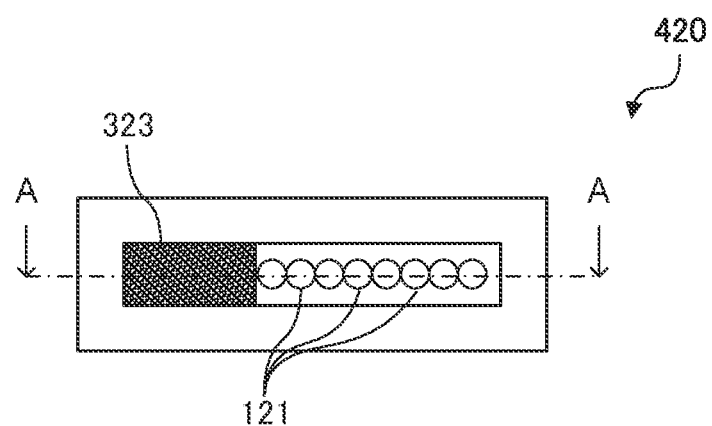
Figure 5C:
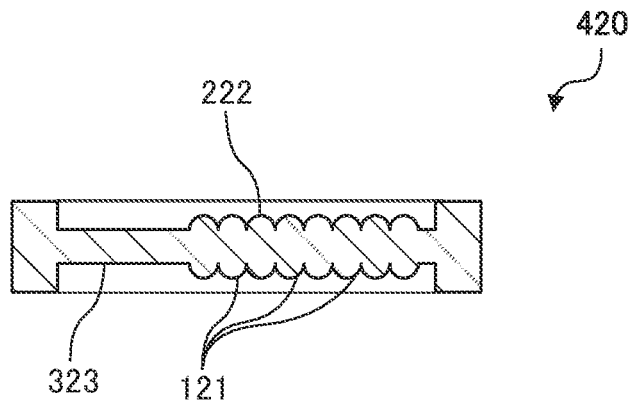

FIGS. 5A to 5C illustrate a configuration of optical receptacle 420 according to Modification 3 of Embodiment 1. FIG. 5A is a plan view of optical receptacle 420 according to Modification 3 of the present embodiment, FIG. 5B is a bottom view of optical receptacle 420, and FIG. 5C is a sectional view taken along line A-A of FIG. 5B.

Configuration of Optical Receptacle

As illustrated in FIGS. 5A to 5C, optical receptacle 420 includes first optical surface 121, second optical surface 222, and diffraction surface 323. In the present embodiment, in the transmission region, first optical surface 121 is a flat surface disposed opposite to photoelectric conversion element 112. In addition, in the present embodiment, in the transmission region, diffraction surface 323 is formed in first optical surface 121. In the present embodiment, no diffraction surface 323 is formed in second optical surface 222.

In the present embodiment, in the reception region, second optical surface 222 is a convex lens surface protruding toward optical transmission member 130. They are disposed opposite to the end surface of optical transmission member 130 in a line along the longitudinal direction. Preferably, the central axis of second optical surface 222 coincides with the central axis of the end surface of optical transmission member 130.

Also in the optical module according to Modification 3 of the present embodiment, diffraction surface 323 is preferably configured such that primary diffraction light reaches the end portion of optical transmission member 130 whereas zero-order diffraction light does not reach the end portion of optical transmission member 130 such that only primary diffraction light reaches the end portion of optical transmission member 130.

Effect

The optical module according to the present embodiment has an effect similar to that of optical module 100 according to Embodiment 1.

Embodiment 2

Configuration of Optical Module

Optical module 500 according to Embodiment 2 differs from optical module 100 according to Embodiment 1 only in the configuration of optical receptacle 520. In view of this, the same configurations as those of optical module 100 are denoted with the same reference numerals and the description thereof is omitted.

Figure 6:
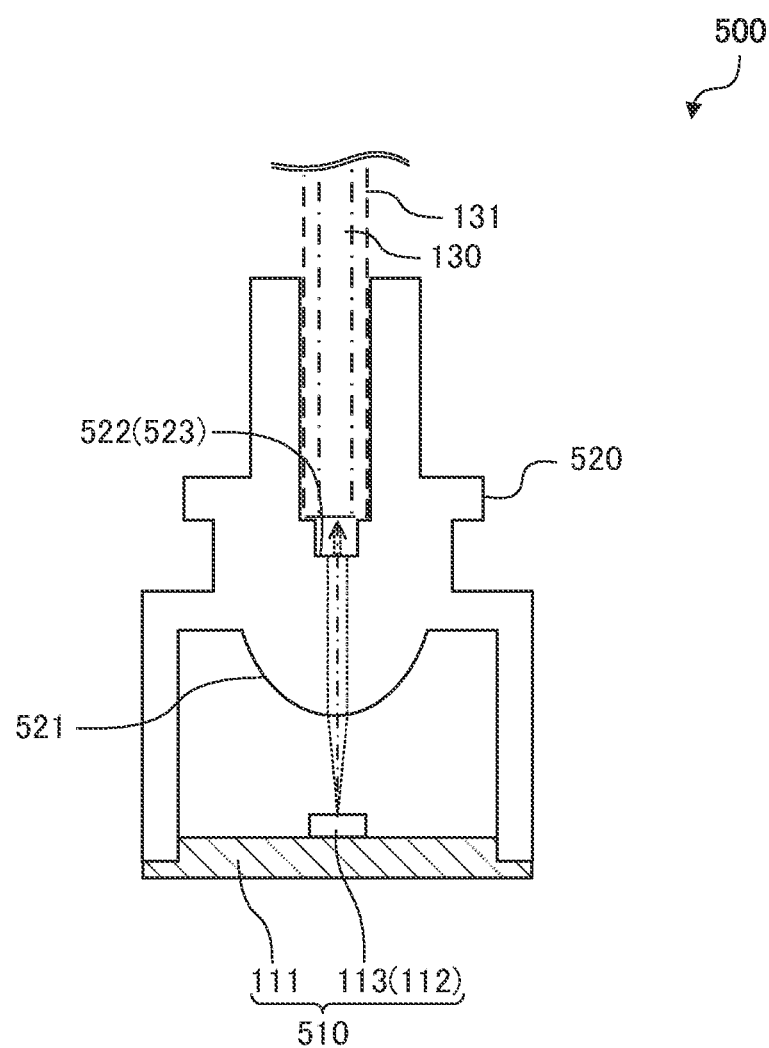
FIG. 6 is a sectional view of an optical module according to Embodiment 2.
Figure 7A:
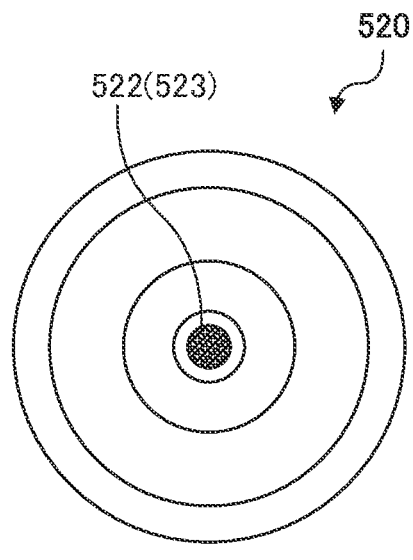
FIGS. 7A to 7C illustrate a configuration of an optical receptacle according to Embodiment 2.
Figure 7B:
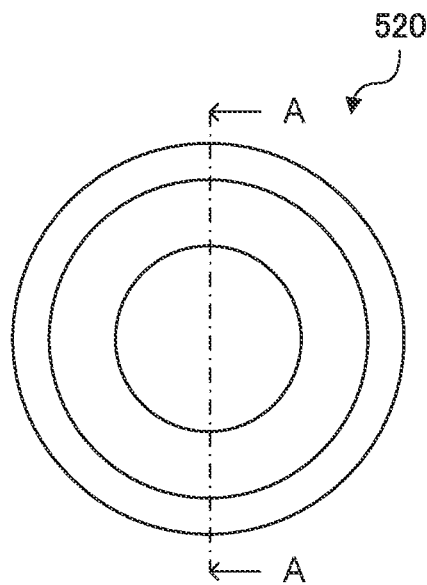
Figure 7C:
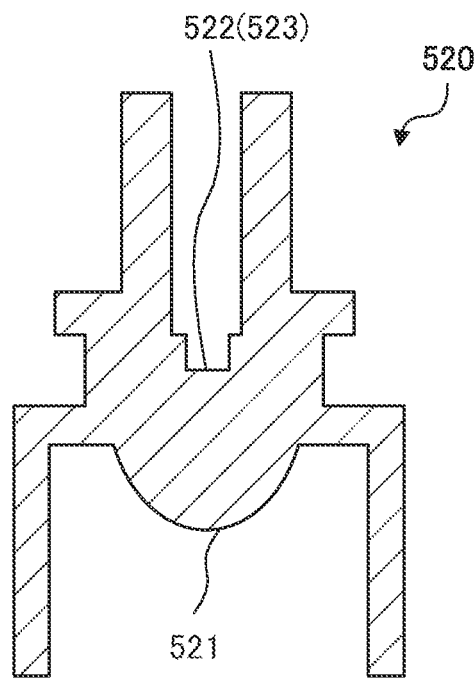

FIG. 6 is a sectional view of optical module 500 according to Embodiment 2. FIGS. 7A to 7C illustrate a configuration of optical receptacle 520 according to Embodiment 2. FIG. 7A is a plan view of optical receptacle 520 according to Embodiment 2, FIG. 7B is a bottom view of optical receptacle 520, and FIG. 7C is a sectional view taken along line A-A of FIG. 7B. Note that in FIG. 6, the hatching of optical receptacle 520 is omitted for illustration of light paths. In FIG. 6, the center of the light flux is illustrated with a dashed line, and the outline of the light flux is illustrated with a dotted line.

As illustrated in FIG. 6, optical module 500 according to Embodiment 2 includes photoelectric conversion device 510 and optical receptacle 520. Optical module 500 according to the present embodiment is transmitting optical module 500. As such, photoelectric conversion element 112 of the present embodiment is light emitting element 113.

Configuration of Optical Receptacle

Optical receptacle 520 according to the present embodiment is a transmitting optical receptacle. Optical receptacle 520 includes first optical surface 521, second optical surface 522, and diffraction surface 523. In the present embodiment, first optical surface 521 is a convex lens surface disposed opposite to light emitting element 113. In the present embodiment, second optical surface 522 is a flat surface disposed opposite to the end surface of optical transmission member 130. In addition, diffraction surface 523 is disposed in second optical surface 522. In optical receptacle 520 of the present embodiment, first optical surface 521 and second optical surface 522 are not arrays. That is, in the present embodiment, one light emitting element 113, one first optical surface 521 and one second optical surface 522 are provided.

Also in the optical module according to the present embodiment, diffraction surface 523 is preferably configured such that primary diffraction light reaches the end portion of optical transmission member 130 whereas zero-order diffraction light does not reach the end portion of optical transmission member 130 such that only primary diffraction light reaches the end portion of optical transmission member 130.

Next, light paths in optical module 500 according to the present embodiment are described. Light emitted from photoelectric conversion element 112 (light emitting element 113) enters optical receptacle 520 from first optical surface 521. At this time, light entered into optical receptacle 520 is converted into collimated light by first optical surface 521, and advances inside optical receptacle 520. Next, the light entered into optical receptacle 520 is emitted by second optical surface 522 toward the end portion of optical transmission member 130. Here, diffraction surface 523 is disposed in second optical surface 522, and therefore, of the diffraction light generated from light advanced inside optical receptacle 520, only primary diffraction light reaches the end portion of optical transmission member 130.

Effect

Optical module 500 according to the present embodiment has an effect similar to that of optical module 100 according to Embodiment 1.

While first optical surface 521 is a convex lens surface and second optical surface 522 is a flat surface in optical receptacle 520 according to Embodiment 2, first optical surface 521 may be a flat surface, and second optical surface 522 may be a convex lens surface. In this case, it is preferable to form diffraction surface 523 in first optical surface 521.

Embodiment 3

Configuration of Optical Module

Optical module 600 according to Embodiment 3 differs from optical module 100 according to Embodiment 1 only in the configuration of optical receptacle 620. In view of this, the same configurations as those of optical module 100 are denoted with the same reference numerals and the description thereof is omitted.

Figure 8:
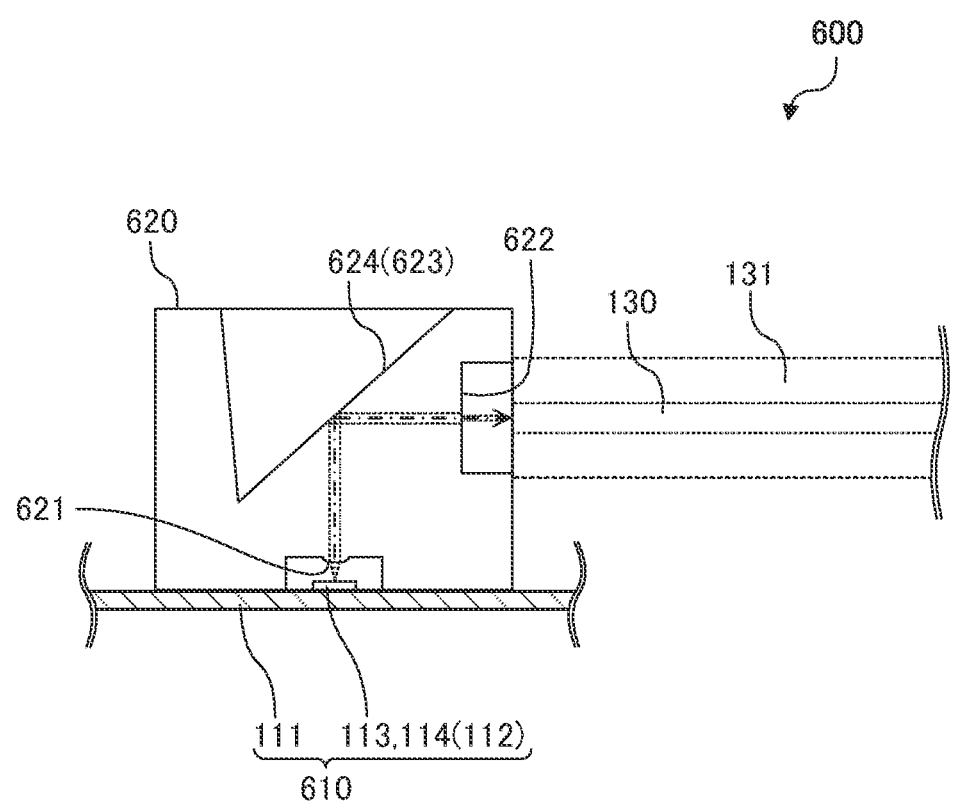
FIG. 8 is a sectional view illustrating a configuration of an optical module according to Embodiment 3.

FIG. 8 is a sectional view of optical module 600 according to Embodiment 3. FIGS. 9A to 9D illustrate a configuration of optical receptacle 620 according to Embodiment 3. FIG. 9A is a plan view of optical receptacle 620 according to Embodiment 3, FIG. 9B is a bottom view of optical receptacle 620, and FIG. 9C is a right side view of optical receptacle 620, and FIG. 9D is a sectional view taken along line A-A of FIG. 9B. Note that in FIG. 8, the hatching of optical receptacle 620 is omitted for illustration of light paths. In FIG. 8, the center of the light flux is illustrated with a dashed line, and the outline of the light flux is illustrated with a dotted line.

As illustrated in FIG. 8, optical module 600 according to Embodiment 3 includes photoelectric conversion device 610 and optical receptacle 620.

Configuration of Optical Receptacle

Optical receptacle 620 according to the present embodiment is a transmitting and receiving optical receptacle. Optical receptacle 620 includes first optical surface 621, second optical surface 622, diffraction surface 623, and third optical surface 624.

Third optical surface 624 is a reflecting surface that reflects, toward second optical surface 622, light entered from first optical surface 621, or is a reflecting surface that emits, toward first optical surface 621, light entered from second optical surface 622. Third optical surface 624 is tilted to approach optical transmission member 130 in the direction from the bottom surface toward the top surface of optical receptacle 620. The inclination angle of third optical surface 624 is not limited. In the present embodiment, the inclination angle of third optical surface 624 is 45° with respect to the optical axis of light incident on third optical surface 624. The shape of third optical surface 624 is not limited. In the present embodiment, the shape of third optical surface 624 is a flat surface. Light entered from first optical surface 621 or second optical surface 622 impinges on third optical surface 624 at an incident angle equal to or greater than a critical angle. Diffraction surface 623 is disposed in third optical surface 624.

Also in optical module 600 according to the present embodiment, diffraction surface 623 is preferably configured such that primary diffraction light reaches the end portion of optical transmission member 130 whereas zero-order diffraction light does not reach the end portion of optical transmission member 130 such that only primary diffraction light reaches the end portion of optical transmission member 130.

Next, light paths in optical module 600 according to the present embodiment are described. Light emitted from photoelectric conversion element 112 (light emitting element 113) enters optical receptacle 620 from first optical surface 621. At this time, light entered into optical receptacle 620 is converted by first optical surface 621 into collimated light, and advances inside optical receptacle 620. The light entered into optical receptacle 620 is reflected by third optical surface 624 toward second optical surface 622. Here, diffraction surface 623 is disposed in third optical surface 624, and therefore, of the diffraction light generated from light advanced inside optical receptacle 520, only primary diffraction light is reflected toward second optical surface 622. The light reflected by third optical surface 624 (primary diffraction light) is emitted toward optical transmission member 130 at the end portion of second optical surface 522 (see FIG. 8). On the other hand, light emitted from optical transmission member 130 enters optical receptacle 620 from second optical surface 622. The light entered into optical receptacle 620 is reflected by third optical surface 624 toward first optical surface 621. The light reflected by third optical surface 624 is emitted to the outside from first optical surface 621. The light emitted at first optical surface 621 reaches light reception element 114.

Effect

Optical module 600 according to the present embodiment has an effect similar to that of optical module 100 according to Embodiment 1.

While diffraction surface 623 is disposed in third optical surface 624 in optical receptacle 620 according to Embodiment 3, diffraction surface 623 may be disposed in first optical surface 621, or in second optical surface 622. In addition, while first optical surface 621 is a convex lens surface protruding toward photoelectric conversion element 112 in optical receptacle 620 according to Embodiment 3, first optical surface 621 may be a flat surface. In addition, while second optical surface 622 is a flat surface in optical receptacle 620 according to Embodiment 3, second optical surface 622 may be a convex lens surface protruding toward the end surface of optical transmission member 130, or a concave lens surface recessed toward the end surface of optical transmission member 130.

INDUSTRIAL APPLICABILITY

The optical receptacle and the optical module according to the embodiments of the present invention are suitable for optical communications using an optical transmission member.

REFERENCE SIGNS LIST 100, 500, 600 Optical module
110, 510, 610 Photoelectric conversion device 111 Substrate
112 Photoelectric conversion element
113 Light emitting element
114 Light reception element
120, 220, 320, 420, 520, 620 Optical receptacle
121, 521, 621 First optical surface
122, 222, 322, 522, 622 Second optical surface
123, 323, 523, 623 Diffraction surface
130 Optical transmission member
131 Ferrule
624 Third optical surface

What is claimed is:

1. An optical receptacle configured to be disposed between a light emitting element and an optical transmission member and configured to optically couple the light emitting element and the optical transmission member, the optical receptacle comprising:
   a first optical surface configured to allow an incidence of light emitted from the light emitting element;
   a second optical surface configured to emit, toward the optical transmission member, light emitted from the light emitting element and advanced inside the optical receptacle;
   a diffraction surface disposed on the first optical surface, on the second optical surface, or on a light path between the first optical surface and the second optical surface, and
   wherein the diffraction surface is configured such that no zero-order diffraction light is generated, and configured to focus only a primary diffraction light toward an end portion of the optical transmission member.

2. The optical receptacle according to claim 1, wherein the diffraction surface is configured such that only the primary diffraction light reaches an end portion of the optical transmission member.

3. The optical receptacle according to claim 1, wherein the diffraction surface is disposed on the second optical surface.

4. The optical receptacle according to claim 1, further comprising a third optical surface disposed on the light path, the third optical surface being configured to reflect, toward the second optical surface, light entered from the first optical surface,
   wherein the diffraction surface is disposed on the third optical surface.

5. An optical module, comprising:
   a photoelectric conversion device including a light emitting element; and
   an optical receptacle configured to optically couple, to an optical transmission member, light emitted from the light emitting element,
   wherein the optical receptacle is the optical receptacle according to claim 1.

6. An optical receptacle configured to be disposed between a light emitting element and an optical transmission member and configured to optically couple the light emitting element and the optical transmission member, the optical receptacle comprising:
   a first optical surface configured to allow an incidence of light emitted from the light emitting element;
   a second optical surface configured to emit, toward the optical transmission member, light emitted from the light emitting element and advanced inside the optical receptacle;
   a diffraction surface disposed on the first optical surface, on the second optical surface, or on a light path between the first optical surface and the second optical surface,
   wherein the diffraction surface is configured such that a main component of diffraction light generated by the diffraction surface is a primary diffraction light, and configured to focus only the primary diffraction light toward an end portion of the optical transmission member, and
   wherein in the diffraction surface, a blaze number, blaze angle, and shape of an installation surface are appropriately set in accordance with an attenuation rate and focusing position of the primary diffraction light.

7. The optical receptacle according to claim 6, wherein the diffraction surface is configured such that only the primary diffraction light reaches the end portion of the optical transmission member.

8. The optical receptacle according to claim 6, wherein the diffraction surface is disposed on the second optical surface.

9. The optical receptacle according to claim 6, further comprising a third optical surface disposed on the light path, the third optical surface being configured to reflect, toward the second optical surface, light entered from the first optical surface,
   wherein the diffraction surface is disposed on the third optical surface.

10. An optical module, comprising:
    a photoelectric conversion device including a light emitting element; and
    an optical receptacle configured to optically couple, to an optical transmission member, light emitted from the light emitting element,
    wherein the optical receptacle is the optical receptacle according to claim 6.

* * * * *